(12) United States Patent
Awano et al.

(10) Patent No.: US 12,336,107 B2
(45) Date of Patent: Jun. 17, 2025

(54) COMPONENT SUPPLY APPARATUS AND COMPONENT MOUNTING APPARATUS

(71) Applicant: YAMAHA HATSUDOKI KABUSHIKI KAISHA, Iwata (JP)

(72) Inventors: Yukinari Awano, Iwata (JP); Takahito Mikami, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 504 days.

(21) Appl. No.: 17/786,456

(22) PCT Filed: Mar. 17, 2020

(86) PCT No.: PCT/JP2020/011650
§ 371 (c)(1),
(2) Date: Jun. 16, 2022

(87) PCT Pub. No.: WO2021/186533
PCT Pub. Date: Sep. 23, 2021

(65) Prior Publication Data
US 2023/0023441 A1      Jan. 26, 2023

(51) Int. Cl.
*B23P 19/00*       (2006.01)
*H05K 13/02*       (2006.01)
*H05K 13/04*       (2006.01)

(52) U.S. Cl.
CPC .................. *H05K 13/02* (2013.01)

(58) Field of Classification Search
CPC ............................ H05K 13/02; H05K 13/0419
See application file for complete search history.

(56) References Cited

U.S. PATENT DOCUMENTS

| 11,291,148 B2 * | 3/2022 | Awano ................ H05K 13/046 |
| 11,576,290 B2 * | 2/2023 | Awano ................ H05K 13/022 |

FOREIGN PATENT DOCUMENTS

| JP | 2011-216793 A | 10/2011 |
| JP | 2018190764 A * | 11/2018 |
| JP | 2020064901 A * | 4/2020 |

OTHER PUBLICATIONS

International Search Report issued in PCT/JP2020/011650; mailed Jun. 16, 2020.

* cited by examiner

*Primary Examiner* — Paul D Kim
(74) *Attorney, Agent, or Firm* — Studebaker Brackett PLLC

(57) ABSTRACT

A component supply apparatus includes a sending part configured to send tape housing a component therein in a sending direction so as to supply the component to a component supply position; a main body having an opposed surface extending in the sending direction, which faces a lower surface of the tape being sent by the sending part; a leaf spring member extending in the sending direction and having both end portions in contact with the opposed surface and a center portion curved upward so as to support the lower surface of the tape while urging the lower surface of the tape upward at the component supply position; and an urging member disposed between the leaf spring member and the opposed surface so as to urge the leaf spring member upward.

20 Claims, 6 Drawing Sheets

COMPONENT SUPPLY APPARATUS AND COMPONENT MOUNTING APPARATUS

CROSS-REFERENCE TO RELATED APPLICATION

This application is a National Stage of International Patent Application No. PCT/JP2020/011650, filed Mar. 17, 2020, the entire contents of which is incorporated herein by reference.

BACKGROUND

Technical Field

The present disclosure relates to a component supply apparatus for sending tape housing a component therein to a component supply position to supply the component and a component mounting apparatus equipped with the component supply apparatus.

Background Art

Conventionally, a component mounting apparatus has been used to mount an electronic component (hereinafter, referred to as a "component") such as a chip component, an IC, or the like onto a printed circuit board. In the component mounting apparatus, the component is supplied by a component supply apparatus referred to as a tape feeder. Then, a head unit provided in the component mounting apparatus mounts the component supplied to a component supply position onto a board.

In the component supply apparatus, tape housing the component therein is unwound from a reel and sent to the above-described component supply position along a groove provided in an upper surface of a main body. During this sending operation, the tape is guided by a guide member referred to as a tape guide, a suppressor, or the like. Specifically, the tape is moved to the component supply position, passing between the guide member and the groove. Further, at the component supply position, a leaf spring member is provided in the groove and supports the tape from below while urging the tape toward the guide member. As the urging support structure in which the tape is urged and supported by the leaf spring member, for example, a structure disclosed in Japanese Patent Application Laid Open Gazette No. 2011-216793 can be adopted.

SUMMARY

In the conventional component supply apparatus, it is difficult to give a sufficient urging force to the tape by the leaf spring member, and when an adsorption nozzle provided in the head unit adsorbs the component from the tape at the component supply position, there sometimes occurs depression, inclination, or the like in the tape. For this reason, deficiency of the urging force is one of main factors to produce an adverse effect on the adsorption of the component by using the adsorption nozzle.

Accordingly, the present disclosure provides a component supply apparatus capable of stably supplying a component housed in tape by giving a sufficient urging force to the tape sent to a component supply position and a component mounting apparatus including the component supply apparatus.

One aspect of the present disclosure is a component supply apparatus, and the component supply apparatus includes a sending part configured to send tape housing a component therein in a sending direction so as to supply the component to a component supply position; a main body having an opposed surface extending in the sending direction, which faces a lower surface of the tape being sent by the sending part; a leaf spring member extending in the sending direction and having both end portions in contact with the opposed surface and a center portion curved upward so as to support the lower surface of the tape while urging the lower surface of the tape upward at the component supply position; and an urging member disposed between the leaf spring member and the opposed surface so as to urge the leaf spring member upward.

In the present disclosure having such a configuration, the urging member urges the leaf spring member upward, which supports the lower surface of the tape while urging the lower surface of the tape. For this reason, besides the urging force from the leaf spring member, the urging force from the urging member is additionally applied to the tape sent to the component supply position, and an urging force sufficient to stably supply the component is given to the tape at the component supply position.

Herein, as the urging member, a wire spring member which has a cross section of a polygonal shape, a round shape, or an oval shape and extends in the sending direction between a pair of leaf spring contact positions where both end portions of the leaf spring member are in contact with the opposed surface may be used. Since both end portions of the wire spring member are in contact with the opposed surface and a center portion thereof is curved upward, to thereby urge the center portion of the leaf spring member upward, it is possible to urge the leaf spring member with high efficiency.

Further, an urging position where the wire spring member urges the leaf spring member may be a position adjacent to the component supply position on the upstream side in the sending direction. In this case, one end portion of the wire spring member in the sending direction may be fixed to the opposed surface and the other end portion thereof may slide on the opposed surface in the sending direction in accordance with the press amount on the center portion of the wire spring member. With this configuration, it is possible to easily absorb the dimensional change to the upstream side in the delivery direction that occurs when the wire spring member is displaced.

Furthermore, a preload part may be provided, the preload part configured to press the center portion of the wire spring member downward to thereby generate a certain elastic force in a no-load condition where no load is applied onto the leaf spring member from above and configured to cancel pressing the center portion of the wire spring member in a load condition where a load not less than the elastic force is applied onto the leaf spring member from above. It is possible to stably perform switching between the no-load condition and the load condition by the preload part.

Further, a runout regulation may be provided, the runout regulation part being configured to regulate the wire spring member from swinging across both sides of the tape in a width direction of the tape between the leaf spring member and the opposed surface. With this runout regulation part, it is possible to keep the posture of the wire spring member constant and to stably urge the leaf spring member.

Furthermore, there may be a configuration where the sending part has a sprocket provided rotatably while being engaged with a feed hole formed in the tape at the component supply position, and a power transmission member disposed below the opposed surface and configured to transmit a rotation driving force to the sprocket to rotate the sprocket. In this case, a protrusion area protruding upward at the component supply position or in the vicinity of the component supply position, corresponding to the power transmission member, is provided and the interval between the protrusion area and the leaf spring member, i.e., a space in a height direction sometimes becomes narrow. On the other hand, the wire spring member has a technical feature that deformation in the height direction at the time when the wire spring member urges the leaf spring member is smaller than that of other urging members, such as a coil spring or the like. For this reason, even in a narrow space where it is difficult to arrange an urging member such as a coil spring or the like, the wire spring member can be arranged.

Further, it is preferable that an urging position where the wire spring member urges the leaf spring member should be the component supply position or a position adjacent to the component supply position in the sending direction, and it is more preferable that the urging position should be a position adjacent to the component supply position on the upstream side in the sending direction. This is because it becomes possible to more stably support the tape by urging the tape before the tape is supplied to the component supply position.

Furthermore, the main body having a groove which extends in the sending direction with an opening formed toward the lower surface of the tape and is provided with a concave space into which the leaf spring member can be fitted from the opening may be used, and an inner bottom surface of the groove can be served as the opposed surface. In this case, the leaf spring member is fitted into the concave space of the groove and the move in a horizontal direction orthogonal to the sending direction is regulated. As a result, the urging by the leaf spring member can be stabilized.

Further, in the component mounting apparatus in which a head unit mounts the component supplied by the above-described component supply apparatus on a board, it is possible to increase the operation rate of a component mounting operation since the component is stably supplied.

Thus, it is possible to give a sufficient urging force to tape sent to a component supply position and stably supply a component housed in the tape.

DETAILED DESCRIPTION

Figure 1:
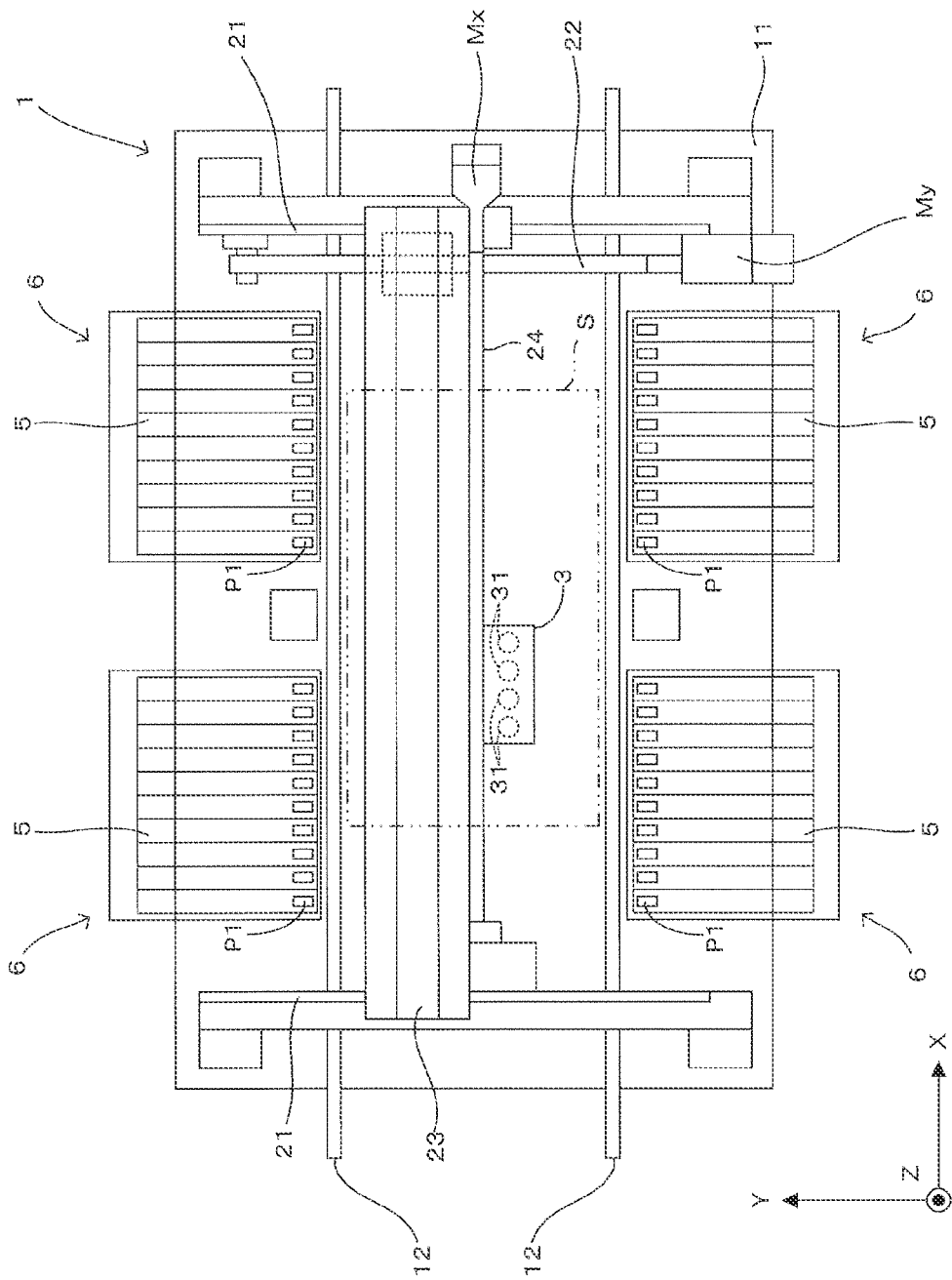
FIG. 1 is a partial plan view schematically showing a component mounting apparatus equipped with a first embodiment of a component supply apparatus in accordance with the present disclosure.

FIG. 1 is a partial plan view schematically showing a component mounting apparatus equipped with a first embodiment of a component supply apparatus in accordance with the present disclosure. In this figure and the following figures, an XYZ rectangular coordinate system with a Z direction parallel to a vertical direction and an X direction and a Y direction each parallel to a horizontal direction is shown as appropriate. This component mounting apparatus 1 includes a pair of conveyors 12 and 12 provided on a base 11. The component mounting apparatus 1 mounts a component on a board S which is loaded from an upstream side in the X direction (board transfer direction) to an operation position (the position of the board S in FIG. 1) by the conveyors 12, and unloads the board S on which the component mounting is completed from the operation position to a downstream side in the X direction by using the conveyors 12.

In the component mounting apparatus 1, a pair of Y-axis rails 21 and 21 extending in the Y direction, a Y-axis ball screw 22 extending in the Y direction, and a Y-axis motor My which rotationally drives the Y-axis ball screw 22 are provided, and a head supporting member 23 is fixed to a nut of the Y-axis ball screw 22, being supported by the pair of Y-axis rails 21 and 21 movably in the Y direction. To the head supporting member 23, attached are an X-axis ball screw 24 extending in the X direction and an X-axis motor Mx which rotationally drives the X-axis ball screw 24, and a head unit 3 is fixed to a nut of the X-axis ball screw 24, being supported by the head supporting member 23 movably in the X direction. Therefore, the Y-axis ball screw 22 can be rotated by using the Y-axis motor My to move the head unit 3 in the Y direction and/or the X-axis ball screw 24 can be rotated by using the X-axis motor Mx to move the head unit 3 in the X direction.

On each of both sides of the pair of conveyors 12 and 12 in the Y direction, two batch exchange trolleys 6 (hereinafter, referred to simply as "trolleys 6") are aligned in the X direction. To each of the trolleys 6, a plurality of tape feeders 5 (hereinafter, referred to simply as "feeders 5") each of which corresponds to the first embodiment of the component supply apparatus of the present disclosure are attached in a detachable/attachable manner. Each of the feeders 5 intermittently sends tape in which chip-like components (chip electronic components) such as an integrated circuit, a transistor, a capacitor, and the like are housed at predetermined intervals, out in the Y direction from a reel held by the trolley 6, to thereby supply the components in the tape to a component supply position P1. Further, the constitution of the feeder 5 will be described later in detail.

Figure 2:
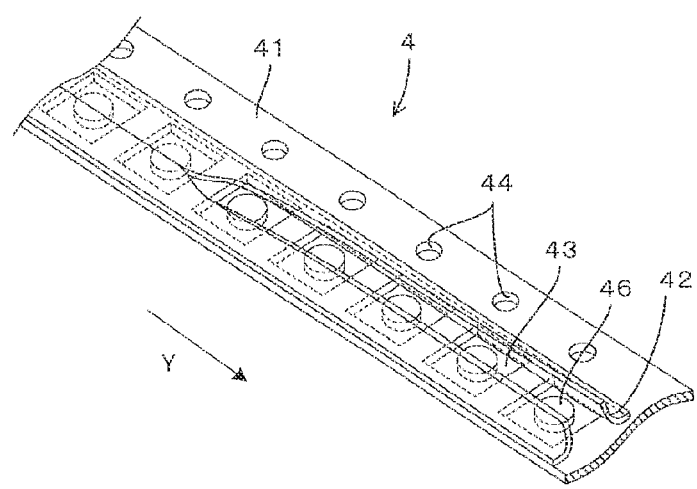
FIG. 2 is a perspective view showing a structure of tape.

FIG. 2 is a perspective view showing a structure of the tape. The tape 4 consists of carrier tape 41 formed of a synthetic resin or paper and thin sheet-like cover tape 42 formed of a synthetic resin to be adhered thereto. The carrier tape 41 has a plurality of component housing parts 43 each having a concave shape opened upward, which are arranged at constant intervals, and each of the component housing parts 43 houses a component 46. The cover tape 42 is fixed to the carrier tape 41 by adhering both left and right edge portions in a width direction of the cover tape 42 to an upper surface of the carrier tape 41 at both edge portions in a left-and-right direction, to thereby prevent the component 46 from dropping off from the component housing part 43. Further, on one edge of the carrier tape 41, provided are a plurality of feed holes 44 arranged at constant intervals along an extending direction of the carrier tape 41.

The cover tape 42 of the tape 4 is sent in the sending direction Y in the feeder 5 as described later and cut by an insert blade (reference sign 533 in FIG. 6) before being supplied to the component supply position P1. More specifically, as shown in FIG. 2, a substantially center portion in the left-and-right direction of the cover tape 42 is cut along the sending direction of the tape 4. The component 46 housed in the component housing part 43 is thereby exposed, and component adsorption by an adsorption nozzle becomes possible at the component supply position P1 as described next.

The component 46 supplied to the component supply position P1 is mounted on the board S by the head unit 3. In the present embodiment, as shown in FIG. 1, the head unit 3 has a plurality of (four) mounting heads 31 aligned in the X direction. Each of the mounting heads 31 has an elongated shape extending in the Z direction (vertical direction) and can adsorb and hold the component by using an adsorption nozzle (reference sign 311 in FIGS. 6 and 7) attached to a lower end of each mounting head 31 in an engageable/disengageable manner. Specifically, the mounting head 31 moves above the feeder 5, and the feeder 5 adsorbs the component 46 supplied to the component supply position P1. Subsequently, the mounting head 31 moves above the board S at an operation position and cancels adsorption of the component 46, to thereby mount the component 46 onto the board S.

Figure 3:
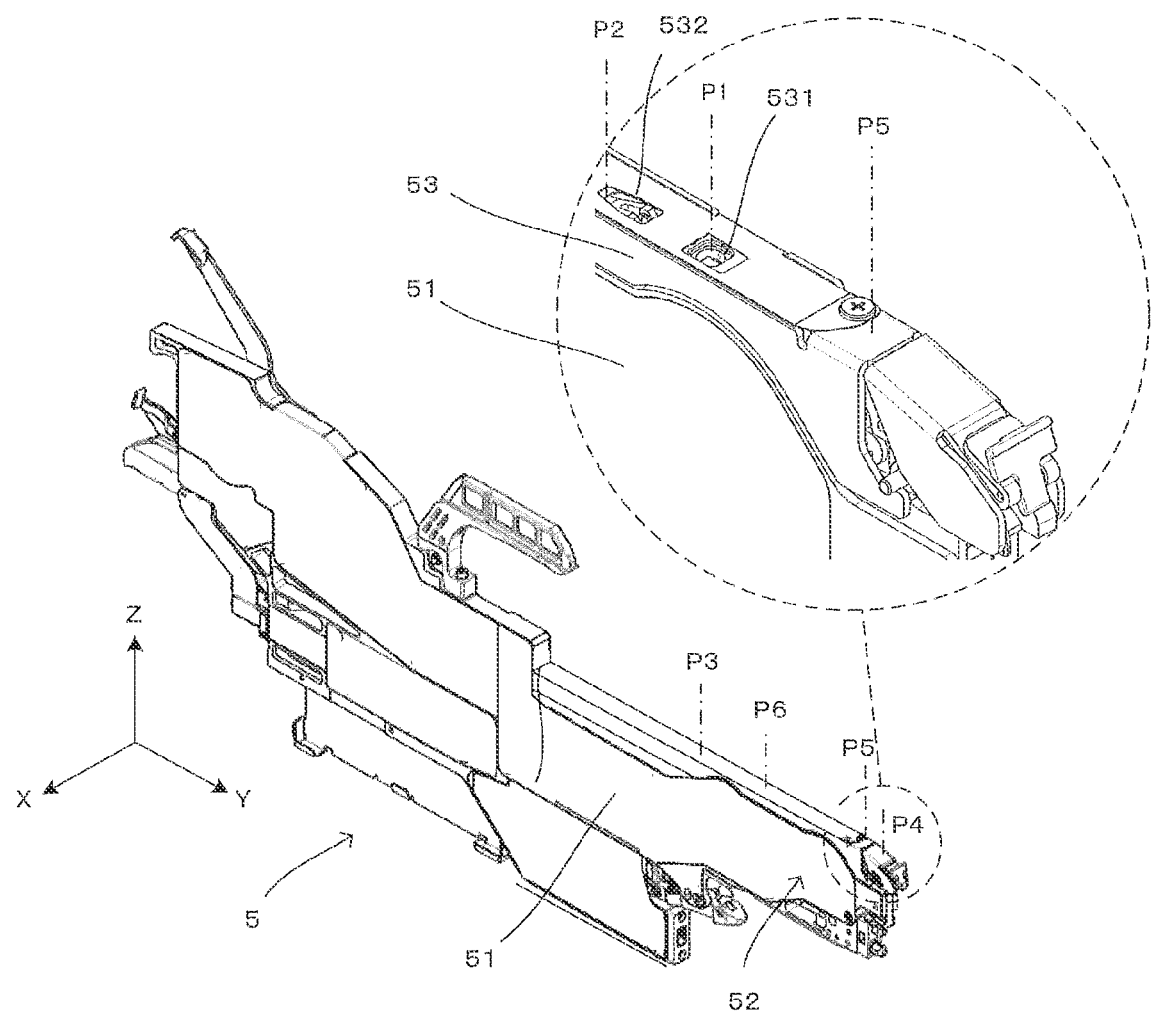
FIG. 3 is a perspective view of a feeder which is the first embodiment of the component supply apparatus in accordance with the present disclosure.
Figure 4:
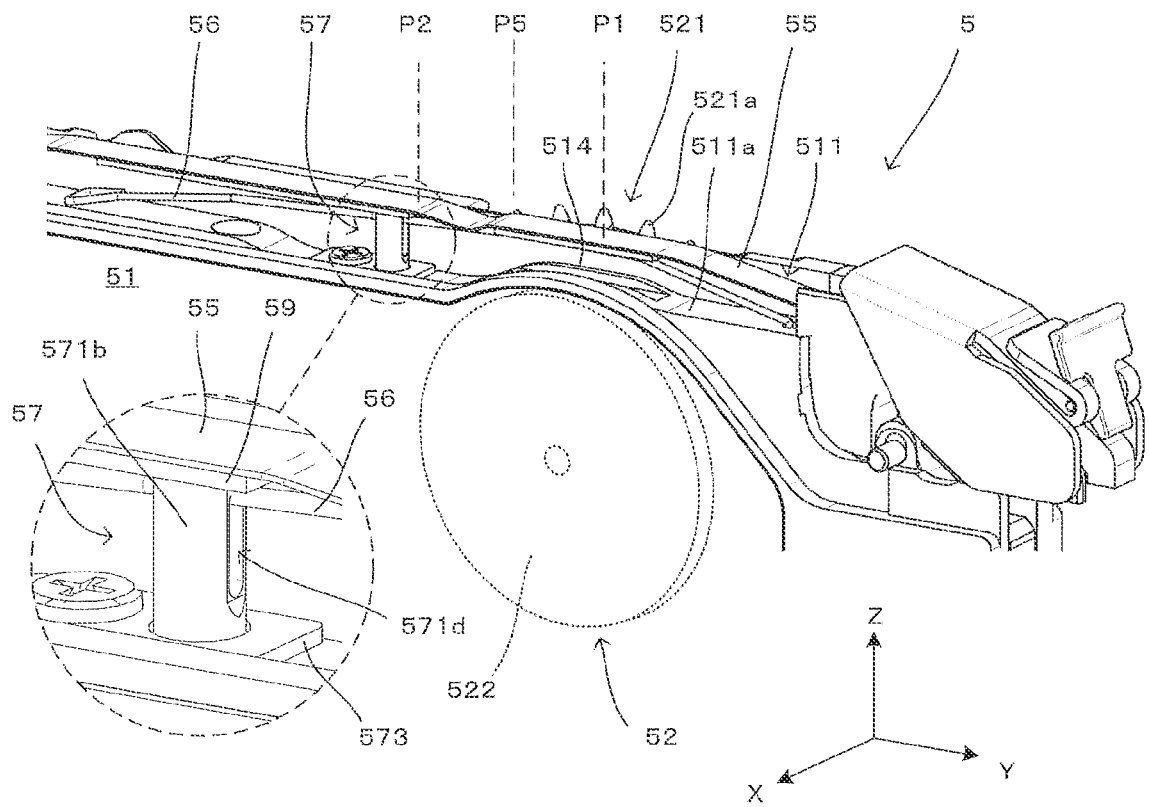
FIG. 4 is a view showing a structure of a feeder tip portion with a guide member being detached therefrom.

Next, with reference to FIGS. 3 to 7, the constitution of the feeder 5 will be described in detail. FIG. 3 is a perspective view of the feeder which is the first embodiment of the component supply apparatus in accordance with the present disclosure. FIG. 4 is a view showing a structure of a feeder tip portion with a guide member being detached therefrom. The feeder 5 is a feeder having an autoloading mechanism for automatically loading the tape 4 which is inserted from an insert port on the upstream side, to the component supply position P1, and has the following constitution. Further, in order to describe the constitution of the feeder 5, for convenience of description, the downstream side (the side toward the conveyor 12, the lower right side in FIG. 3) in the sending direction Y in which the component 46 is sent out toward the component supply position is assumed as a front side, and conversely, the upstream side (the side going away from the conveyor 12, the upper left side in FIG. 3) in the sending direction Y is assumed as a rear side. Furthermore, a direction orthogonal to both the front-and-rear direction (Y direction) and the up-and-down direction (Z direction) of the feeder 5 is assumed as a width direction (X direction) of the feeder 5. Further, the front-and-rear direction (Y direction) and the width direction (X direction) of the feeder 5 correspond to the sending direction and the width direction of the tape 4, respectively.

To the trolley 6, a plurality of feeders 5 are attachable, being aligned in the X direction. In each feeder 5, in order to send the tape 4 holding the component 46 toward the component supply position P1, as shown in FIG. 3, a main body 51 having a long shape in the front-and-rear direction (Y direction) is provided with a front-side sending part 52 and a rear-side sending part 54.

Among them, the front-side sending part 52 is provided in a front-side portion of the main body 51. As shown in FIG. 4, the front-side sending part 52 has a front-side sprocket 521, a front-side motor (not shown) serving as a driving source of the front-side sprocket 521, and a front-side gear group 522 which transmits a rotation driving force generated by the front-side motor to the front-side sprocket 521. The front-side motor is drive-controlled in response to an operation command from a control part (not shown) for controlling the apparatus on the whole. The power of the front-side motor is transmitted to the front-side sprocket 521 through the front-side gear group 522 and rotates the front-side sprocket 521 at the component supply position P1. On an outer periphery of this front-side sprocket 521, gears 521a to be engaged with the feed holes 44 of the tape 4 are formed at regular pitches. Herein, part of the front-side gear group 522 indicated by a dotted line in FIG. 3 functions as a "power transmission member" of the present disclosure and is disposed below a groove 511 of the main body 51 at the component supply position P1. This groove 511 extends in the sending direction Y with an opening formed toward a lower surface of the tape 4 sent by the front-side sending part 52 in an upper surface portion of the main body 51. In the groove 511, a concave space is provided, into which a leaf spring member described later in detail can be fitted from the opening, and an inner bottom surface 511a of the groove 511 faces the lower surface of the tape 4 and corresponds to an exemplary "opposed surface" of the present disclosure. In a portion of this inner bottom surface 511a which corresponds to the component supply position P1, provided is a protrusion area 514 protruding upward, corresponding to the power transmission member. For this reason, at the component supply position P1, the interval between the inner bottom surface 511a of the groove 511 and a leaf spring member 55 is narrow and a narrow space is formed.

Further, though not shown in FIG. 3 or 4, in the front-side sending part 52, an intermediate sprocket is disposed on an upstream side of the front-side sprocket 521 in the sending direction Y of the tape 4 and receives the rotation driving force through the front-side gear group 522 to be rotated. On an outer periphery of this intermediate sprocket, like on that of the front-side sprocket 521, gears to be engaged with the feed holes 44 of the tape 4 are formed at regular pitches. Therefore, the front-side sending part 52 rotates the front-side sprocket 521 and the intermediate sprocket with the gears engaged with the feed holes 44 of the tape 4, respectively, to thereby send the tape 4 being sent from the side of the rear-side sending part 54 to the component supply position P1 along the groove 511 provided in the front-side upper surface of the main body 51. Further, the rear-side sending part 54 basically has the same configuration as that of the front-side sending part 52 except that only one sprocket is provided.

In order to guide the tape 4 sent out to the component supply position P1 thus, as shown in FIG. 3, provided is a guide member 53. The guide member 53 is an elongated member extending in the Y direction (front-and-rear direction) and detachable/attachable from/to the main body 51 so as to cover the groove 511 from above. Specifically, by disposing the tape 4 along the groove 511 and then attaching the guide member 53 to the main body 51, it becomes possible to send the tape 4. During the sending of the tape 4, the guide member 53 guides the running of the tape 4 sent along the groove 511 by the front-side sending part 52.

As shown in a partially enlarged view of FIG. 3, in an upper surface of the guide member 53, provided are an opening 531 for take-out of the component in accordance with the component supply position P1 and an opening 532 formed to face an exposure mechanism. When the guide member 53 is attached to the main body 51, the opening 531 is positioned at the component supply position P1 and it becomes possible to take out the component 46 by using the adsorption nozzle (reference sign 311 in FIGS. 6 and 7). Further, an insert blade 533 for cover-tape cutting is positioned below the opening 532. Furthermore, the insert blade 533 is attached, facing the cover tape 42, inside the guide member 53 and a tip portion thereof is positioned at a tape cutting position P2.

A not-shown spring is coupled with the guide member 53 having such a configuration and moves in the up-and-down direction Z in accordance with the thickness of the tape 4 while pressing down the tape 4 being sent in the sending direction Y from above. Further, the leaf spring member 55 is disposed between the lower surface of the tape 4 and the inner bottom surface 511a of the groove 511 and supports the tape 4 while urging the tape 4 from above. Furthermore, as shown in FIG. 4, the feeder 5 has a wire spring member 56 for urging the leaf spring member 55 upward in the vicinity of the component supply position P1 and a pusher part 57 for pressing the leaf spring member 55 upward in the vicinity of the tape cutting position P2.

Figure 5:
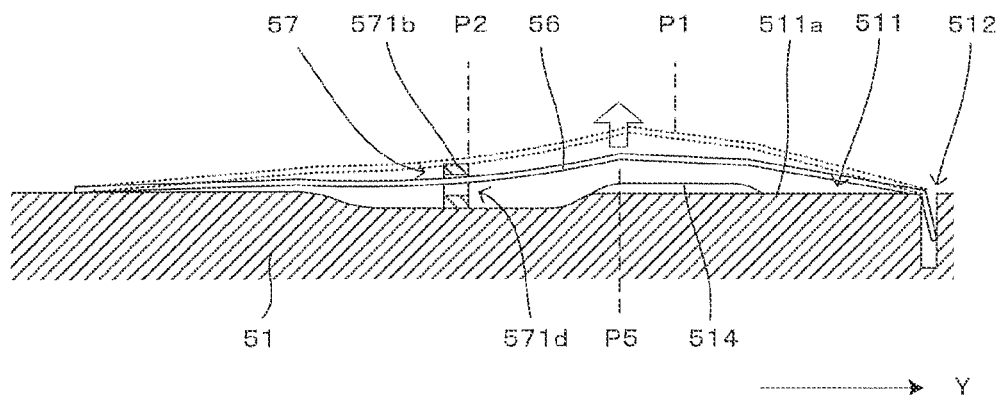
FIG. 5 is a view schematically showing an attachment state of a wire spring member to a groove.
Figure 6:
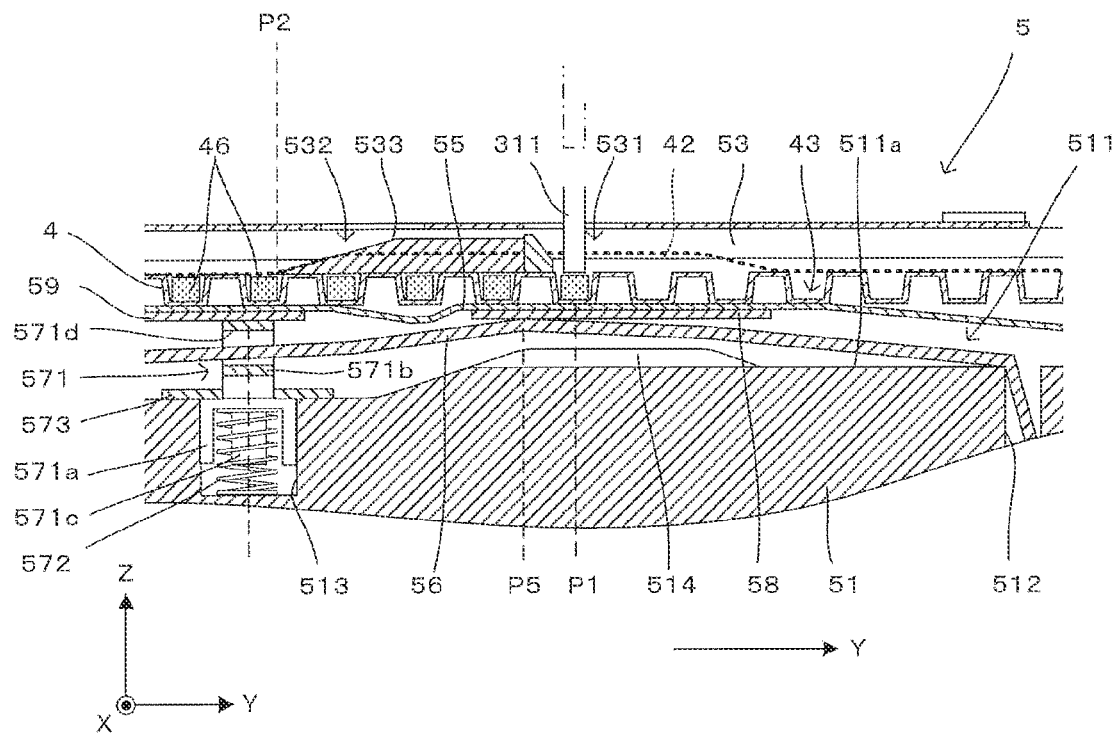
FIG. 6 is a partial cross section along a sending direction of the feeder shown in FIG. 3.
Figure 7:
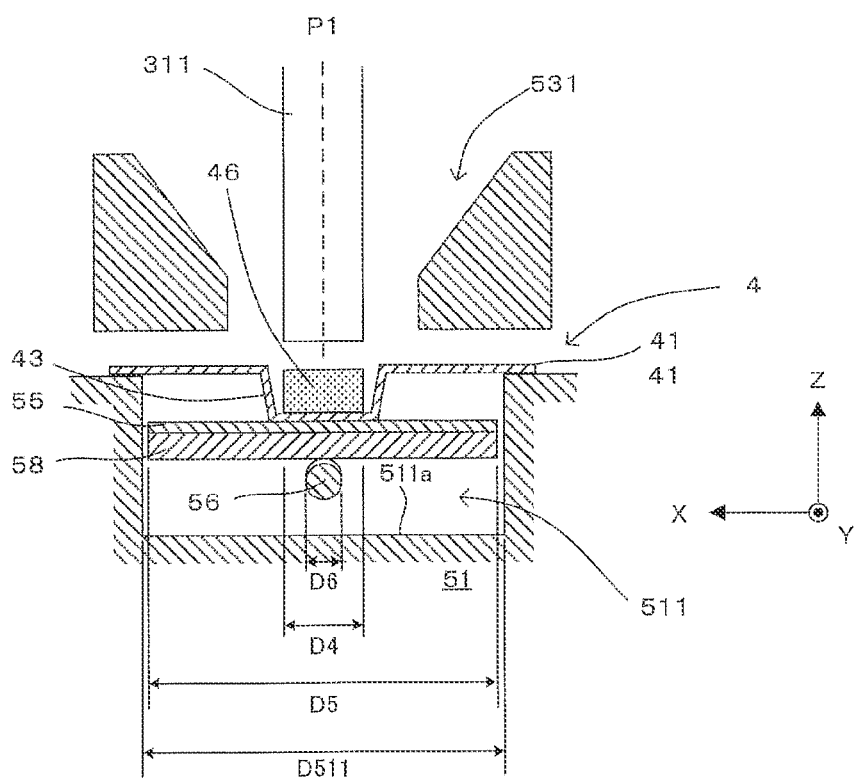
FIG. 7 is a partial cross section along a width direction of the feeder at a component supply position.

FIG. 5 is a view schematically showing an attachment state of the wire spring member to the groove. FIG. 6 is a partial cross section along the sending direction of the feeder shown in FIG. 3. FIG. 7 is a partial cross section along the width direction of the feeder at the component supply position. The leaf spring member 55 extends in the sending direction Y. The leaf spring member 55 has a width size D5 which is slightly narrower than the size (width size D511) of the groove 511 in the width direction X as shown in FIG. 7, and can be fitted into the concave space of the groove 511. When the leaf spring member 55 is fitted into the concave space of the groove 511, both end portions thereof come into contact with the inner bottom surface 511a of the groove 511. A rear-side end portion thereof is fixed at a leaf spring contact position (reference sign P3 in FIG. 3) by a screw (not shown), and on the other hand, a front-side end portion thereof is slidable on the inner bottom surface 511a of the groove 511 at a leaf spring contact position (reference sign P4 in FIG. 3). A center portion of the leaf spring member 55 is curved upward (+Z) and in contact with the lower surface of the tape 4, in more detail, a bottom of the component housing part 43 as shown in FIG. 6. Thus, the leaf spring member 55 supports the tape 4 while urging upward against the tape 4 which is pressed down by the guide member 53. Further, in order to send the tape and support the tape, as shown in FIG. 7, the width size D5 of the leaf spring member 55 in the width direction X is made narrower than the width size of the carrier tape 41 and made wider than a width size D4 of the component housing part 43. Furthermore, the same applies to a magnet 58 described next.

The magnet 58 is attached to a lower surface of the leaf spring member 55 at the component supply position P1 and in the front and rear thereof. With a magnetic force from this magnet 58, the posture of the component 46 positioned at the component supply position P1 is stabilized and the adsorption of the component 46 by the adsorption nozzle 311 can be performed favorably. Similarly, a magnet 59 is attached to the lower surface of the leaf spring member 55 at the tape cutting position P2 and in the front and rear thereof, and tape cutting by the insert blade 533 is stably performed.

Herein, the leaf spring member 55 supports the tape 4 while urging the tape 4 upward, but it is difficult for only the leaf spring member 55 to elastically support the tape 4. Then, in the present disclosure, an urging member such as an elastic member or the like such as a spring, rubber, a resin, or the like is added below the magnet 58 positioned at the component supply position P1 and in the front and rear thereof, to thereby urge the leaf spring member 55 upward. It thereby becomes possible to give a sufficient urging force to the tape 4 sent to the component supply position P1 and stably supply the component 46 housed in the tape 4. Further, a portion where an urging force particularly needs to be given, including the component supply position P1 is pressed through the leaf spring member 55 supporting the entire component housing part 43 both in the width direction X and sending direction Y, instead of using the wire spring member 56 to directly press. Hence, it is possible to press and urge by a necessary force, without deforming part of the bottom of the component housing part 43. At the component supply position P1, however, since the protrusion area 514 is provided as described above, the interval between the inner bottom surface 511a of the groove 511 and the tape 4 becomes narrower. Specifically, a setting space for the urging member becomes narrower in the up-and-down direction Z. Then, in the present embodiment, the wire spring member 56 is used as the "urging member" of the present disclosure in order to deal with such a spatial constraint.

The wire spring member 56 is a spring steel wire which has a round-shape cross section having a diameter D6 (<D4<D5<D511) and finished to have a shape in accordance with the shape of a narrow space sandwiched by the magnet 58 and the inner bottom surface 511a of the groove 511. In other words, the wire spring member 56 extends in the sending direction Y, between the leaf spring member 55 and the inner bottom surface 511a of the groove 511 in the up-and-down direction Z and between a pair of leaf spring contact positions P3 and P4 (see FIG. 3) in the sending direction Y. Both end portions of the wire spring member 56 are in contact with the inner bottom surface 511a of the groove 511. As shown in FIGS. 5 and 6, the front-side end portion thereof is inserted, being folded in an obtuse angle, into a concave portion 512 provided from the inner bottom surface 511a of the groove 511 downward. The front-side end portion of the wire spring member 56 is locked by the main body 51 and fixed. On the other hand, the rear-side end portion thereof is slidable on the inner bottom surface 511a of the groove 511 and slides on the inner bottom surface 511a of the groove 511 in the sending direction Y in accordance with the press amount on the center portion of the wire spring member 56 as described next. As a matter of course, the relation of both end portions of the wire spring member 56 may be interchanged with each other. Specifically, there may be a configuration where the rear-side end portion of the wire spring member 56 is fixed and the front-side end portion thereof is slidable.

In a free state where there is no constraint, the center portion of the wire spring member 56 is significantly curved upward (+Z) as indicated by a dotted line in FIG. 5 and disposed on the inner bottom surface 511a of the groove 511 so that the center portion of the wire spring member 56 may be positioned along the protrusion area 514. Then, as shown in FIG. 6, when the tape 4 is set in the feeder 5 and a load is applied to the leaf spring member 55, the curved portion is pushed downward in accordance with the downward move of the leaf spring member 55 and the magnet 58 and an elastic force in accordance with the press amount is generated in the wire spring member 56. This elastic force is given to the leaf spring member 55 through the magnet 58, as the urging force. Thus, an increase in the urging force to be given to the tape 4 is ensured.

Herein, it is preferable that the urging position P5 in the center portion of the wire spring member 56, which is in contact with a lower surface of the magnet 58 to urge the leaf spring member 55 should be set at the component supply position P1 or a position adjacent to the component supply position P1 in the sending direction Y. Considering the following point, however, as shown in FIG. 6, it is optimal that the urging position P5 should be positioned on the upstream side of the component supply position P1 in the sending direction Y. Specifically, the opening 531 of the guide member 53 is present at the component supply position P1 and the tape 4 is positioned with the component 46 exposed upward. For this reason, if the urging position P5 is made coincident with the component supply position P1, the tape 4 is free of being pressed on the opposite side (upper side) of the urging position P5 with the tape 4 interposed therebetween. On the other hand, when an adjacent position deviated from the component supply position P1 in the sending direction Y is determined as the urging position P5, an urging force is given with the tape 4 pressed by the guide member 53. As a result, it is possible to more preferably supply the component 46 while stabilizing the posture of the tape 4 before the tape 4 is supplied to the component supply position P1.

Further, in the present embodiment, in a no-load condition, the center portion of the wire spring member 56 is pushed downward by the pusher part 57 and a certain elastic force is generated in the wire spring member 56. Herein, the "no-load condition" refers to a condition before the tape 4 is set in the feeder 5, in other words, a condition where no load is applied to the leaf spring member 55 with the guide member 53 detached from the main body 51. Such an operation for pushing the center portion of the wire spring member 56 downward by the pusher part 57 and generating a certain elastic force in the wire spring member 56 is referred to as "preload" in the present specification. This preload produces the following effect.

In a case where preload is not performed, when the guide member 53 is attached to the main body 51, it is necessary to push the guide member 53 downward against the urging force equivalent to the preload. Conversely, when the guide member 53 is detached from the main body 51 and no load is applied, the above-described urging force is applied to the leaf spring member 55 at a breath and there occurs inconvenience such as a case where the leaf spring member 55 bursts upward from the main body 51 or the like case. Thus, the operating efficiency is reduced by the increase in the urging force due to addition of the wire spring member 56. On the other hand, it is possible to prevent the reduction in the operating efficiency by performing the preload. In other words, it is possible to give a sufficient urging force to the tape 4 sent to the component supply position P1 and stably supply the component 46 housed in the tape 4 without any reduction in the operating efficiency in setting the tape 4 into the feeder 5 or taking out the tape 4 from the feeder 5.

The pusher part 57 for performing such preload functions as a "preload part" of the present disclosure, and in the present embodiment, the pusher part 57 also functions as a "tape-cutting stabilizing part" and a "runout regulation part" of the present disclosure. Hereinafter, with reference to FIGS. 4 to 6, the constitution and operation of the pusher part 57 will be described.

As shown in FIG. 6, the pusher part 57 is provided in the vicinity of the insert blade 533 on the upstream side in the sending direction Y. The pusher part 57 has a movable member 571 which is movable in the Z direction, a coil spring 572 for urging the movable member 571 upward, and a stopper 573. The movable member 571 has a base portion 571a having a bottle cap shape, a push portion 571b protruding upward from the base portion 571a, and an insertion portion 571c which protrudes downward from the base portion 571a and is inserted into a hollow portion of the coil spring 572. The outer diameter of the base portion 571a is slightly narrower than the inner diameter of a concave portion 513 provided downward from the inner bottom surface 511a of the groove 511, and the inner diameter of the base portion 571a is narrower than the outer diameter of the coil spring 572. For this reason, when the coil spring 572 is inserted into the concave portion 513 and the base portion 571a is inserted into the concave portion 513 while the insertion portion 571c is inserted into the hollow portion of the coil spring 572, capping of an upper end portion of the coil spring 572 is performed by the base portion 571a.

The push portion 571b has a cylindrical shape which is slimmer than that of the base portion 571a, and a step portion is formed between the base portion 571a and the push portion 571b. The stopper 573 is fixed to the inner bottom surface 511a of the groove 511 with the step portion pushed into the concave portion 513. For this reason, as shown in FIGS. 4 and 5, in the above-described no-load condition, the step portion is locked by the stopper 573 and the push portion 571b rises at the maximum. On the other hand, when the tape 4 is set in the feeder 5 and a load is applied to the leaf spring member 55 as shown in FIG. 6, the movable member 571 is pushed downward in accordance with the downward move of the leaf spring member 55 and the magnet 59, against the urging force of the coil spring 572, in the vicinity of the tape cutting position P2. An elastic force in accordance with the press amount at that time is generated in the coil spring 572 and given to the leaf spring member 55 through the magnet 59, as the urging force. With this push-up by the pusher part 57, the posture of the tape 4 is fixed in the vicinity of the tape cutting position P2, and tape cutting is more stably performed by the insert blade 533. Thus, the pusher part 57 functions also as the "tape-cutting stabilizing part".

Further, in the push portion 571b of the pusher part 57, as shown in FIGS. 4 to 6, a guide hole 571d is provided therethrough in parallel with the sending direction Y and the wire spring member 56 is inserted through the guide hole 571d. The guide hole 571d has a long hole shape in the up-and-down direction Z and allows the move of the wire spring member 56 in the up-and-down direction Z. Therefore, in the no-load condition, as shown in FIGS. 4 and 5, the wire spring member 56 is locked in an upper inner peripheral surface of the guide hole 571d, to thereby stably perform the above-described preload. Furthermore, as shown in FIG. 6, even when the tape 4 is set in the feeder 5 and a load is applied to the leaf spring member 55, to thereby move the wire spring member 56 and the movable member 571 of the pusher part 57 in the up-and-down direction Z, it is possible to reliably avoid the up-and-down move and interference of the wire spring member 56. On the other hand, the move of the wire spring member 56 in the width direction X is controlled on an inner surface of the guide hole 571d. For this reason, giving of the urging force by the wire spring member 56 can be stably continued. Thus, the pusher part 57 functions also as the "runout regulation part" of the present disclosure.

Thus, in the present embodiment, since the wire spring member 56 urges the leaf spring member 55 through the magnet 58, it is possible to give a sufficient urging force to the tape 4 sent to the component supply position P1. As a result, it is possible to stably supply the component 46 housed in the tape 4 and increase the operation rate of the component mounting apparatus 1.

Further, due to the existence of the front-side gear group 522, the inner bottom surface 511a of the groove 511 has a protrusion area 514 protruding upward at the component supply position P1. For this reason, the interval between the inner bottom surface 511a of the groove 511 and the leaf spring member 55 is narrow and the space is a narrow space. In the present embodiment, however, the wire spring member 56 is disposed so that the center portion thereof is curved along the protrusion area 514 as shown in FIGS. 5 and 6. The wire spring member 56 has a technical feature that deformation in a height direction (the up-and-down direction Z) at the time when the wire spring member 56 urges the leaf spring member 55 is smaller than that of other urging members, such as a coil spring or the like. Therefore, even under such a narrow space condition, it is possible to effectively give the urging force to the leaf spring member 55 by the wire spring member 56.

Furthermore, since the pusher part 57 having a function as the "preload part" and the "runout regulation part" is provided, it is possible to more stably give the urging force by the wire spring member 56 and increase the reliability of component supply.

Further, a constituent element other than the pusher part 57, for example, a wire spring locking part adopted in the second embodiment described later may be provided as the "preload part" of the present disclosure, the "runout regulation part" may be separately provided, or a constituent element serving as both the "preload part" and "runout regulation part" may be added. When the pusher part 57 functions also as the "preload part" and the "runout regulation part", however, it is possible to reduce the number of components of the feeder 5.

Figures 8A, 8B, 8C:
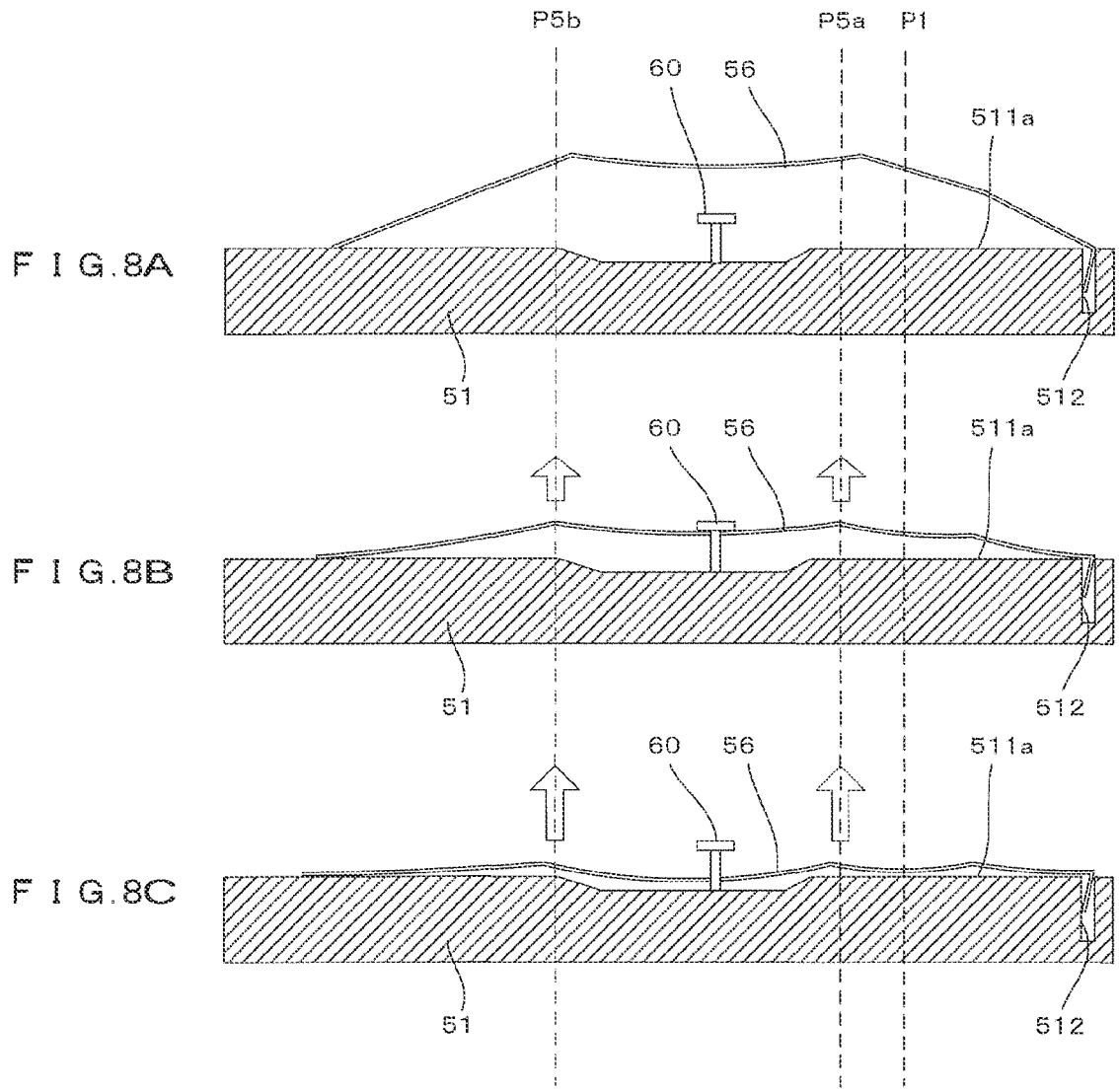
FIGS. 8A-8C are views schematically showing an attachment state of the wire spring member to the groove in a second embodiment of the component supply apparatus in accordance with the present disclosure.

Furthermore, the present disclosure is not limited to the above-described embodiment and numerous modifications and variations can be added to those described above without departing from the scope of the disclosure. In the above-described embodiment, for example, the wire spring member 56 uses one portion in the center portion to urge the leaf spring member 55, and in other words, the urging position P5 is only one portion. As a matter of course, the number of urging positions P5 is not limited to this, a plurality of portions, for example, two urging positions P5a and P5b may be provided as shown in FIGS. 8A-8C (the second embodiment). In this case, there may be a configuration where the wire spring locking part 60 stands from the inner bottom surface 511a of the groove 511 between the urging positions P5a and P5b and the wire spring member 56 is locked by the wire spring locking part 60, to thereby perform the preload, in the no-load condition.

Further, there may be another configuration where instead of the above-described wire spring locking part 60, a member having the same shape as that of the push portion 571b stands from the inner bottom surface 511a of the groove 511 and the wire spring member 56 is inserted through the guide hole, to thereby achieve preload and runout regulation at the same time.

Furthermore, though the cross section of the wire spring member 56 has a round shape in the above-described embodiment, the cross section of the wire spring member 56 may have an oval shape or a polygonal shape other than the round shape. Further, the number of wire spring members 56 is not limited to one but may be two or more. Since the setting space for the wire spring member 56 is narrow, however, it is preferable that the width size D6 of the wire spring member 56 in the width direction X should be restrained to 50% or less of the width size D5 of the leaf spring member 55 (FIG. 7).

Further, though the present disclosure is applied to the feeder 5 of such a type as shown in FIG. 2, in which the cover tape 42 is cut by the insert blade 533 in the above-described embodiment, the present disclosure can be applied to each of the feeder of a type in which both the adhesive portions of the carrier tapes 41 on both sides of the cover tape 42 in the width direction X are peeled off and the feeder of another type in which only one-side adhesive portion is peeled off by autoloading. Furthermore, the present disclosure can be applied to any feeder other than the feeder having an autoloading function.

The present disclosure can be applied to a general component supply apparatus for sending tape housing a component therein to a component supply position to thereby supply a component and a general component mounting apparatus equipped with the component supply apparatus.

What is claimed is:

1. A component supply apparatus, comprising:
    a sending part configured to send a tape, housing a component therein, in a sending direction to supply the component to a component supply position;
    a main body having an opposed surface extending in the sending direction, which faces a lower surface of the tape being sent by the sending part;
    a leaf spring member extending in the sending direction and having both end portions in contact with the opposed surface and a center portion curved upward to support the lower surface of the tape while urging the lower surface of the tape upward at the component supply position; and
    an urging member disposed between the leaf spring member and the opposed surface to urge the leaf spring member upward.

2. The component supply apparatus according to claim 1, wherein
    the urging member is a wire spring member which has a cross section of a polygonal shape, a round shape, or an oval shape and extends in the sending direction between a pair of leaf spring contact positions where both end portions of the leaf spring member are in contact with the opposed surface, and
    both end portions of the wire spring member are in contact with the opposed surface and a center portion thereof is curved upward to urge the center portion of the leaf spring member upward.

3. The component supply apparatus according to claim 2, wherein
    an urging position where the wire spring member urges the leaf spring member is a position adjacent to the component supply position on an upstream side in the sending direction, and
    one end portion of the wire spring member in the sending direction is fixed to the opposed surface and the other end portion thereof is configured to slide on the opposed surface in the sending direction in accordance with a press amount on the center portion of the wire spring member.

4. The component supply apparatus according to claim 2, further comprising:
    a preload part configured to press the center portion of the wire spring member downward to thereby generate a certain elastic force in a no-load condition where no load is applied onto the leaf spring member from above and configured to cancel pressing the center portion of the wire spring member in a load condition where a load not less than the elastic force is applied onto the leaf spring member from above.

5. The component supply apparatus according to claim 2, further comprising:
    a runout regulation part configured to regulate the wire spring member from swinging across both sides of the tape in a width direction of the tape between the leaf spring member and the opposed surface.

6. The component supply apparatus according to claim 2, wherein the sending part has a sprocket provided rotatably while being engaged with a feed hole formed in the tape at the component supply position, and a power transmission member disposed below the opposed surface and configured to transmit a rotation driving force to the sprocket to rotate the sprocket, the opposed surface has a protrusion area protruding upward at the component supply position or in a vicinity of the component supply position, corresponding to the power transmission member, and the wire spring member is disposed so that the center portion thereof is along the protrusion area.

7. The component supply apparatus according to claim 2, wherein an urging position where the wire spring member urges the leaf spring member is the component supply position or a position adjacent to the component supply position in the sending direction.

8. The component supply apparatus according to claim 7, wherein the urging position is a position adjacent to the component supply position on an upstream side in the sending direction.

9. The component supply apparatus according to claim 1, wherein the main body has a groove which extends in the sending direction with an opening formed toward the lower surface of the tape and is provided with a concave space into which the leaf spring member is fitted from the opening, and an inner bottom surface of the groove is the opposed surface.

10. A component mounting apparatus, comprising:
a component supply apparatus according to claim 1; and
a head unit configured to mount components supplied by the component supply apparatus on a board.

11. The component supply apparatus according to claim 3, further comprising:

a preload part configured to press the center portion of the wire spring member downward to thereby generate a certain elastic force in a no-load condition where no load is applied onto the leaf spring member from above and configured to cancel pressing the center portion of the wire spring member in a load condition where a load not less than the elastic force is applied onto the leaf spring member from above.

12. The component supply apparatus according to claim 3, further comprising:

a runout regulation part configured to regulate the wire spring member from swinging across both sides of the tape in a width direction of the tape between the leaf spring member and the opposed surface.

13. The component supply apparatus according to claim 4, further comprising:

a runout regulation part configured to regulate the wire spring member from swinging across both sides of the tape in a width direction of the tape between the leaf spring member and the opposed surface.

14. The component supply apparatus according to claim 3, wherein the sending part has a sprocket provided rotatably while being engaged with a feed hole formed in the tape at the component supply position, and a power transmission member disposed below the opposed surface and configured to transmit a rotation driving force to the sprocket to rotate the sprocket, the opposed surface has a protrusion area protruding upward at the component supply position or in a vicinity of the component supply position, corresponding to the power transmission member, and the wire spring member is disposed so that the center portion thereof is along the protrusion area.

15. The component supply apparatus according to claim 4, wherein the sending part has a sprocket provided rotatably while being engaged with a feed hole formed in the tape at the component supply position, and a power transmission member disposed below the opposed surface and configured to transmit a rotation driving force to the sprocket to rotate the sprocket, the opposed surface has a protrusion area protruding upward at the component supply position or in a vicinity of the component supply position, corresponding to the power transmission member, and the wire spring member is disposed so that the center portion thereof is along the protrusion area.

16. The component supply apparatus according to claim 5, wherein the sending part has a sprocket provided rotatably while being engaged with a feed hole formed in the tape at the component supply position, and a power transmission member disposed below the opposed surface and configured to transmit a rotation driving force to the sprocket to rotate the sprocket, the opposed surface has a protrusion area protruding upward at the component supply position or in a vicinity of the component supply position, corresponding to the power transmission member, and the wire spring member is disposed so that the center portion thereof is along the protrusion area.

17. The component supply apparatus according to claim 2, wherein the main body has a groove which extends in the sending direction with an opening formed toward the lower surface of the tape and is provided with a concave space into which the leaf spring member is fitted from the opening, and an inner bottom surface of the groove is the opposed surface.

18. The component supply apparatus according to claim 3, wherein the main body has a groove which extends in the sending direction with an opening formed toward the lower surface of the tape and is provided with a concave space into which the leaf spring member is fitted from the opening, and an inner bottom surface of the groove is the opposed surface.

19. A component mounting apparatus, comprising:
a component supply apparatus according to claim 2; and
a head unit configured to mount components supplied by the component supply apparatus on a board.

20. A component mounting apparatus, comprising:
a component supply apparatus according to claim 3; and
a head unit configured to mount components supplied by the component supply apparatus on a board.

* * * * *